United States Patent
Schröder et al.

(10) Patent No.: US 11,719,765 B2
(45) Date of Patent: Aug. 8, 2023

(54) SENSOR FOR MEASURING A MAGNETIC FIELD

(71) Applicants: Humboldt-Universität zu Berlin, Berlin (DE); Fraunhofer-Gesellschaft zur Förderung der angewandten Forschung e.V., Munich (DE)

(72) Inventors: Tim Schröder, Berlin (DE); Felipe Perona Martinez, Berlin (DE); Julian Bopp, Berlin (DE); Moritz Kleinert, Berlin (DE); Hauke Conradi, Berlin (DE)

(73) Assignees: Humboldt-Universität zu Berlin, Berlin (DE); Fraunhofer-Gesellschaft zur Förderung der angewandten Forschung e. V., Munich (DE)

( * ) Notice: Subject to any disclaimer, the term of this patent is extended or adjusted under 35 U.S.C. 154(b) by 0 days.

(21) Appl. No.: 17/739,066

(22) Filed: May 6, 2022

(65) Prior Publication Data

US 2022/0390529 A1    Dec. 8, 2022

(30) Foreign Application Priority Data

Jun. 4, 2021    (EP) .................................... 21177745

(51) Int. Cl.
    *G01R 33/32*     (2006.01)
    *G01R 33/032*    (2006.01)
    *G01R 33/02*     (2006.01)

(52) U.S. Cl.
    CPC ....... *G01R 33/032* (2013.01); *G01R 33/0206* (2013.01)

(58) Field of Classification Search
    CPC .............. G01R 33/00; G01R 33/0035; G01R 33/0023; G01R 33/0017; G01R 31/3191;
    (Continued)

(56) References Cited

U.S. PATENT DOCUMENTS 8,179,133 B1 * 5/2012 Kornev ............. G01R 33/0354
                                                  324/225
8,947,080 B2    2/2015 Lukin et al.
(Continued)

FOREIGN PATENT DOCUMENTS

CN    105137371 A1    12/2015
EP    2 718 735 B1     2/2016
(Continued)

OTHER PUBLICATIONS

Jean-Philippe Tetienne, et al.; "Scanning Nanospin Ensemble Microscope for Nanosclae Magnetic and Thermal Imaging"; ACS Publications; Nano Letters; Jan. 4, 2016; vol. 16; No. 1; pp. 326-333; XP055860920, US, ISSN: 1530-6984, DOI: 10.1021/acs.nanolett.5b03877.
(Continued)

*Primary Examiner* — Jermele M Hollington
*Assistant Examiner* — Taqi R Nasir
(74) *Attorney, Agent, or Firm* — Gordon Rees Scully; Mansukhani, LLP

(57) ABSTRACT

An embodiment of the invention relates to a sensor comprising a sensor element (10) for measuring a magnetic field, the sensor element (10) comprising a set of at least two first input ports (I1), a set of at least two exit ports (E) each of which is connected to one of the first input ports (I1) via a corresponding first beam path (B1), a set of at least two second input ports (I2) each of which is connected to a second beam path (B2), wherein the first beam paths (B1) extend through a common plane (CP) located inside the sensor element (10), said plane (CP) comprising a plurality of magneto-optically responsive defect centers, wherein the second beam paths (B2) also extend through said common plane (CP), but are angled with respect to the first beam paths (B1) such that a plurality of intersections between the
(Continued)

first and second beam paths (B2) is defined, and wherein each intersection forms a sensor pixel (P) located at at least one of said magneto-optically responsive defect centers.

17 Claims, 4 Drawing Sheets

(58) Field of Classification Search
CPC .. G01R 33/032; G01R 33/0206; G01B 7/004; G01C 17/38; G06F 3/017; G06F 3/0346; G06F 3/012
See application file for complete search history.

(56) References Cited

U.S. PATENT DOCUMENTS

| | | | |
|---|---|---|---|
| 9,658,301 | B2 | 5/2017 | Walsworth |
| 10,082,545 | B2 | 9/2018 | Jeske et al. |
| 10,459,041 | B2 | 10/2019 | Hahn et al. |
| 2010/0315079 | A1 | 12/2010 | Lukin et al. |
| 2012/0088674 | A1* | 4/2012 | Faley ................ G01R 33/0354 505/150 |
| 2013/0107352 | A1 | 5/2013 | Santori et al. |
| 2016/0146904 | A1 | 5/2016 | Stetson, Jr. et al. |
| 2016/0174867 | A1 | 6/2016 | Hatano et al. |
| 2019/0235031 | A1 | 8/2019 | Ibrahim et al. |
| 2020/0057117 | A1 | 2/2020 | Nishibayashi et al. |
| 2020/0309873 | A1* | 10/2020 | Ledbetter ............. G01R 33/032 |

FOREIGN PATENT DOCUMENTS

| | | |
|---|---|---|
| EP | 3 480 614 A1 | 5/2019 |
| WO | 2012/174019 A1 | 12/2012 |
| WO | 2018/128543 A1 | 7/2018 |
| WO | 2018/174918 A1 | 9/2018 |

OTHER PUBLICATIONS

Felix M. Stürner et al.; "Compact Integrated Magnetometer based on Nitrogen-Vacancy Centres in Diamond" Diamond & Related Materials; vol. 93 (2019); pp. 59-65.

Hannah Clevenson et al.; "Broadband Magnetometry and Temperature Sensing with a Light Trapping Diamond Waveguide"; arxiv. org, Cornell University library, 201 Olin Library Cornell University Ithaca, NY 14853, Jun. 20, 2014, XP081390207, DOI: 10.1038/NPHYS3291.

Extended European Search Report dated Nov. 22, 2021 issued by the European Patent Office in related European Patent Application No. 21 177 745.3; filed Jun. 4, 2021.

F. Dolde et al.; "Electric-Field Sensing Using Single Diamond Spins"; Nature Physics; vol. 7, Apr. 17, 2011; DOI: 10.1038/NPHYS1969.

P. Kehayias et al.; "Infrared Absorption Band and Vibronic Structure of the Nitrogen-Vacancy Center in Diamond"; Physical Review B 88; 165202 (2013); DOI: 10.1103/PhysRevB.88.165202.

Kim Donggyu et al.; "CMOS-Integrated Diamond Nitrogen-Vacancy Quantum Sensor"; ArXiv:1810.01056v1; Oct. 2, 2018.

V.M. Acosta et al.; "Broadband Magnetometry by Infrared-Absorption detection of Nitrogen-Vacancy Ensembles in Diamond"; Applied Physics Letter; vol. 97; 174104 (2010).

Y. Dumeige et al.; "Magnetometry with Nitrogen-Vacancy Ensembles in Diamond based on Infrared Absorption in a Doubly Resonant Optical Cavity"; Physical Review B 87; 155202 (2013); DOI: 1^0.1103/PHysRevB.87.

L. Rondin et al.; "Magnetometry wth nitrogen-vacancy defects in diamond"; IOP Publishing, Reports on Progress in Physics; Rep. Prog. Phys. 77; (2014); 056503 (26pp); doi: 10.1088/0034-4885/77/5/056503.

Romana Schirhagl et al., "Nitrogen-Vacancy Centers in Diamond: Nanoscale Sensors for Physics and Biology"; PC65CH05-Degen, Advance Review in (ARI); Nov. 12, 2013.

* cited by examiner

SENSOR FOR MEASURING A MAGNETIC FIELD

CROSS REFERENCE TO RELATED APPLICATION

The present application claims the benefit of and priority to European Patent Application EP 21 177 745.3 filed on Jun. 4, 2021. The foregoing application is incorporated by reference herein in its entirety.

The invention relates to sensors and methods for measuring a magnetic field.

BACKGROUND OF THE INVENTION

The current technology of highly sensitive magnetic field measurement relays mainly in the use of Superconducting Quantum Interference Devices (SQUIDs). In terms of sensitivity, a second option was proposed a few years ago with the implementation of a Spin Exchange Relaxation-Free (SERF) magnetometer. Both technologies have found applications where the measurement of weak magnetic fields is relevant. For example, in the medical industry, the SQUIDs magnetometers have allowed the measurement of small cerebral currents, promoting the development of the magnetoencephalography. SERF magnetometers have been built to target the same application, demonstrating reduced sensitivity compared with the state of the art (SQUIDs). The drawback of using SQUIDs is the needing of cooling the system down close to absolute zero. This requires complex, expensive and large equipment, and restricts the applications where the sensors can effectively operate. In addition, SQUIDs and SERF magnetometers need to operate in a magnetic-free environment. In practice, the magnetometers have to be installed inside a room shielded with a Faraday cage.

The publication "Magnetometry with nitrogen-vacancy defects in diamond" (L Rondin, J-P Tetienne, T Hingant, J-F Roch, P Maletinsky and V Jacques; Reports on Progress in Physics 77 (2014) 056503; doi:10.1088/0034-4885/77/5/056503) reviews the recent progress in high-sensitivity nanoscale magnetometry based on nitrogen-vacancy (NV) centres in diamond. FIG. 1 of this publication shows a magnetic sensor with a single sensor pixel for the detection of a weak magnetic field.

The publication "Nitrogen-Vacancy Centers in Diamond: Nanoscale Sensors for Physics and Biology" (Romana Schirhagl, Kevin Chang, Michael Loretz, and Christian L. Degen, Annu. Rev. Phys. Chem. 2014. 65:83-105) describes another single-pixel magnetic sensor based on nitrogen-vacancy (NV) centres in diamond.

OBJECTIVE OF THE PRESENT INVENTION

An objective of the present invention is to provide a sensor that can be manufactured at low costs and allows measuring the strength of the magnetic field simultaneously or consecutively for different locations.

BRIEF SUMMARY OF THE INVENTION

An embodiment of the present invention relates to a sensor comprising a sensor element for measuring a magnetic field, the sensor element comprising a set of at least two first input ports, a set of at least two exit ports each of which is connected to one of the first input ports via a corresponding first beam path, a set of at least two second input ports each of which is connected to a second beam path, wherein the first beam paths extend through a common plane located inside the sensor element, said plane comprising a plurality of magneto-optically responsive defect centers, wherein the second beam paths also extend through said common plane, but are angled with respect to the first beam paths such that a plurality of intersections between the first and second beam paths is defined, and wherein each intersection forms a sensor pixel located at at least one of said magneto-optically responsive defect centers.

The sensor according to the above embodiment provides a plurality of sensor pixels that are arranged in the same common plane. The pixels can be read out consecutively or for instance line-wise simultaneously in order to characterize the magnetic field in two-dimensions. The position of the sensor pixels in the common plane is defined by the positions of the intersections. There is no need for additional fabrication steps to define the pixel positions.

The first beam paths are preferably parallel, and the second beam paths are preferably parallel. The first beam paths may be perpendicular to the second beam paths.

Planes of intersections (e.g. two-dimensional arrays) may be stacked in order to provide a three-dimensional sensor. The stack of planes may be located in the same sensor element (e.g. the same diamond plate with Nitrogen-Vacancy defect centers) or in a stack of sensor elements (e.g. a stack of diamond plates with Nitrogen-Vacancy defect centers).

The sensor may comprise a set of detectors each of which is individually assigned to one of the exit ports.

The sensor may comprise an evaluation unit that is connected to said set of detectors and configured to evaluate detection signals of the detectors in order to generate one or more measurement values. The measurement values may characterize the magnetic field strength. The evaluation of the detected radiation preferably includes evaluating the absorption of the first radiation in the respective first beam path since the absorption of the first radiation may correlate to the magnetic field strength at the location of the activated sensor pixel, i.e., the location where the first radiation is intersected by the second radiation.

The sensor may comprise a first emitter unit which is capable of generating a first radiation and activating at least one of the first beam paths by injecting the first radiation.

The sensor may comprise a second emitter unit which is capable of generating a second radiation and activating at least one of the second beam paths by injecting the second radiation.

The sensor may comprise a control unit configured to control the first and second emitter unit.

The sensor may comprise a microwave generator capable of generating a microwave field at the intersection points of the beam paths. The microwave generator may be configured to change the microwave frequency over time. For instance, the microwave generator may periodically increase or decrease the microwave frequency in a ramp-wise fashion.

The control unit is preferably configured to control the second emitter unit such that maximally one of the second beam paths is provided with the second radiation in each moment of time.

In an exemplary embodiment, the control unit may be configured to control the first emitter unit to input the first radiation into the first beam paths consecutively, i.e., into only one first beam path at each moment in time. The evaluation unit may evaluate the detection signals of the detectors also consecutively in order to generate measurement values for a single first beam path at each moment in time.

In another exemplary embodiment, the control unit may be configured to control the first emitter unit to input the first radiation into all of the first beam paths simultaneously. The evaluation unit may be configured to evaluate the detection signals of the detectors simultaneously in order to generate measurement values for all first beam paths simultaneously.

The sensor may comprise a printed circuit board located on top of the sensor element or below the sensor element. The printed circuit board may provide at least one antenna. The antenna may be a magnetic coil. The microwave generator is preferably configured to provide a microwave signal to said at least one antenna or coil to generate a microwave field in the sensor element. The sensor may also comprise means for temperature stabilization.

The printed circuit board may comprise a plurality of antennae or coils which are each assigned to one of the intersections. This allows providing each of the intersections with an individual microwave field that is generated by the individually assigned antenna or coil.

The sensor may comprise a carrier on which the sensor element is mounted. The carrier may also carry one or more of the other elements mentioned above, for instance the detectors, the evaluation unit, the first emitter unit, the second emitter unit, the control unit and/or the microwave generator.

The carrier may provide at least one groove that carries a fiber. The fiber may connect one of the input ports with the first or second emitter unit, or connect one of the exit ports with one of the detectors.

At least one of the first and second emitter units may comprise emitter elements (e. g. lasers or photodiodes) that are each individually assigned to one of the input ports. Such individually assigned emitter elements may be mounted on the carrier.

Further, at least one lens may be mounted on the carrier between one of the input ports and the fibre, between one of the emitter elements and the respective input port, or between one of the exit ports and the respective detector, for instance in order to reduce coupling losses.

At least one of the first or second beam paths may be provided with a waveguide that is integrated in the sensor element and guides the radiation through said common plane.

Additionally, or alternatively, the sensor may comprise a pixel position control unit that is capable of varying the positions and/or directions of the beam paths and therefore capable of varying the positions of the intersections (=positions of the sensor pixels).

The pixel position control unit may comprise integrated micro-mechanical control components that change the positions of the input and output ports, and/or movable lenses or mirrors that influence the beam paths. The pixel position control unit or parts thereof may be carried by the carrier.

The sensor element preferably consists of or comprises a diamond plate having Nitrogen-Vacancy defect centers. The first radiation is preferably infrared (e.g. near infrared) radiation and the second radiation is preferably green radiation. The Nitrogen-Vacancy defect centers may be distributed homogeneously or inhomogeneously. For instance, the concentration of the defect centers may be higher in vicinity to pixels or intersections of laser beams than remote from them.

The sensor element may comprise reflection sections (e.g. reflection coatings on the input or output ports) that reflect portions of the first or second radiation in order that the radiation passes the respective beam paths at least twice.

Another embodiment of the present invention relates to a method of measuring a magnetic field, for instance using a sensor as described above, the method comprising the steps of injecting a first radiation into at least one of the first beam paths, injecting a second radiation into at least one of the second beam paths, generating a microwave field at least at the intersection point where the at least one of the first beam paths and at the least one of the second beam paths intersect, detecting the first radiation upon passing the corresponding exit port or ports, and evaluating the detected radiation and generating one or more measurement values that describe the magnetic field at the intersection or intersections where the first and second radiation intercept.

If the first radiation is simultaneously injected into all of the first beam paths, and the second radiation is injected into a single one of the second beam paths, measurement values may be generated simultaneously for each of the sensor pixels that belong to the activated second beam path.

The steps of evaluating the detected radiation and generating one or more measurement values preferably includes measuring the absorption of the first radiation after passing the first beam path.

BRIEF DESCRIPTION OF THE DRAWINGS

In order that the manner in which the above-recited and other advantages of the invention are obtained will be readily understood, a more particular description of the invention briefly described above will be rendered by reference to specific embodiments thereof which are illustrated in the appended drawings. Understanding that these drawings depict only typical embodiments of the invention and are therefore not to be considered to be limiting of its scope, the invention will be described and explained with additional specificity and detail by the use of the accompanying drawings in which.

DETAILED DESCRIPTION OF THE PREFERRED EMBODIMENTS

The preferred embodiments of the present invention will be best understood by reference to the drawings. It will be readily understood that the present invention, as generally described and illustrated in the figures herein, could vary in a wide range. Thus, the following more detailed description of the exemplary embodiments of the present invention, as represented in the figures, is not intended to limit the scope of the invention, as claimed, but is merely representative of presently preferred embodiments of the invention.

Figure 1:
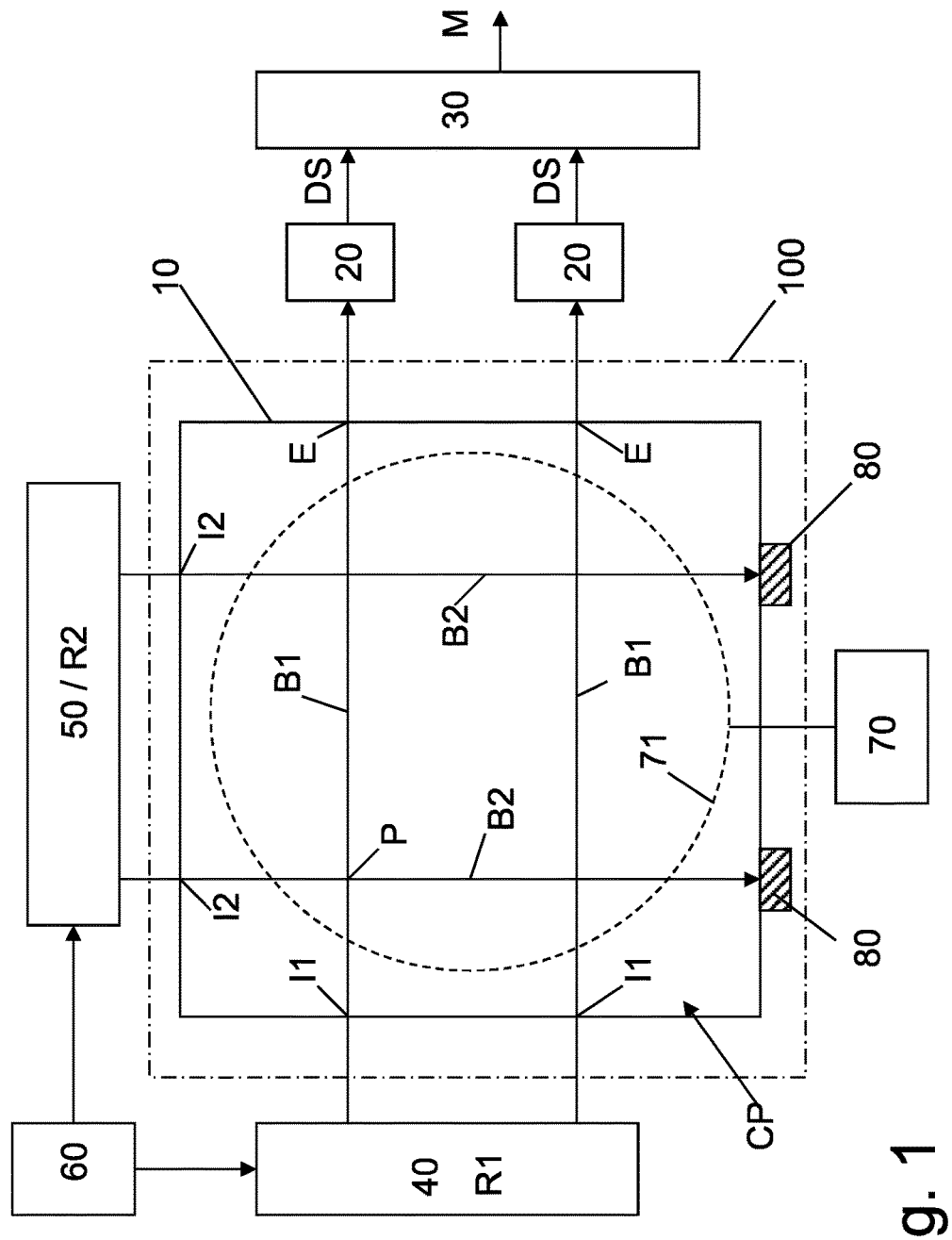
FIG. 1 illustrates a top view of a first exemplary embodiment of a sensor according to the present invention.

FIG. 1 shows a top view of an exemplary embodiment of a sensor according to the present invention. The sensor comprises a sensor element 10, a set of detectors 20, an evaluation unit 30, a first emitter unit 40, a second emitter unit 50, a control unit 60, and a microwave generator 70.

The first emitter unit 40 is configured to generate a first radiation R1 and the second emitter unit 50 is configured to generate a second radiation R2. The first radiation R1 is preferably infrared laser light and the second radiation R2 is preferably green laser light.

The sensor element 10 consists of or at least comprises a diamond plate. The diamond plate incorporates a plurality of magneto-optically responsive defect centers which are very small and therefore not explicitly illustrated in FIG. 1.

The sensor element 10 also comprises a set of first input ports I1 and a set of exit ports E. Each of the exit ports E is connected to one of the first input ports I1 via a corresponding first beam path B1.

A set of second input ports I2 is connected to second beam paths B2 which may terminate at an absorbing layer or at absorbing terminal pads 80 as shown in FIG. 1. Alternatively, one could couple the green laser beams in optical fibres and dissipate that energy far from the sensor.

The first beam paths B1 are parallel and extend through a common plane CP located inside the sensor element 10. The magneto-optically responsive defect centers mentioned above are also located in said common plane CP and may therefore influence radiation that passes the first beam paths B1.

The second beam paths B2 are also parallel and also extend through the common plane CP, but are angled with respect to the first beam paths B1. The first and second beam paths B1/B2 therefore define a plurality of intersections. Each intersection between one of the first and second beam paths B1/B2 forms a sensor pixel P.

In the exemplary embodiment of FIG. 1 the first beam paths B1 are perpendicular to the second beam paths B2 such that intersections form grid or a two-dimensional array of sensor pixels P.

The concentration of the magneto-optically responsive defect centers inside the diamond plate preferably exceeds $0.5 \ 10^{23} \ m^{-3}$ in order to make sure that each of the sensor pixels P is positioned at or within the influence of at least one of the magneto-optically responsive defect centers. At each sensor pixel P, a magnetic field may be sensed at the respective pixel position when the first and second radiation R1/R2 interact with one or more magneto-optically responsive defect centers under the influence of a microwave field that is generated by the microwave generator 70.

Each of the detectors 20 is individually assigned to one of the exit ports E and allows measuring the first radiation R1 and in particular the absorption of the first radiation R1. The absorption is caused by the magneto-optically responsive defect centers that are activated by the second radiation R2 and the microwave field of the microwave generator 70. Since the absorption also depends on the strength of the external magnetic field, the detection signals DS of the detectors characterize the magnetic field.

The evaluation unit 30 is connected to the detectors 20 and configured to evaluate the detection signals DS of the detectors 20 in order to generate measurement values M that indicate the strength of the magnetic field for the activated sensor pixels P. The evaluation of the detection signals DS preferably includes evaluating the absorption of the first radiation R1 after passing the respective first beam path since the degree of absorption depends on the strength of the external magnetic field and the frequency of the applied microwaves and therefore describes the magnetic field strength.

During operation of the sensor, the first emitter unit 40 generates the first radiation R1 and activates at least one of the first beam paths B1 by injecting the first radiation R1. The second emitter unit 50 generates the second radiation R2 and activates one of the second beam paths B2 by injecting the second radiation R2. To this end, the first and second emitter unit are controlled by the control unit 60.

For instance, the control unit 60 may control both the first and the second emitter unit such that maximally one of the first beam paths B1 and one of the second beam paths B2 is provided with the first or second radiation R1/R2 in each moment of time. In other words, each of the sensor pixels P may be addressed individually. The two-dimensional array of sensor pixels P may then be read out pixel-wise by sequentially providing each of the intersections with both the first and second radiation R1/R2. The evaluation unit 30 may then output sequentially measurement values M individually for each sensor pixel P.

Alternatively, the control unit 60 may control the first emitter unit 40 to input the first radiation R1 into all of the first beam paths B1 simultaneously. In the latter case, the evaluation unit 30 may evaluate the detection signals DS of the detectors 20 simultaneously in order to generate simultaneously one measurement value M per first beam path B1. The two-dimensional array of sensor pixels P may then be read out line-wise by sequentially providing each of the second beam paths B2 with the second radiation R2. The evaluation unit 30 may output in parallel measurement values M individually for each line of activated sensor pixels P.

In the first exemplary embodiment of FIG. 1, the microwave generator 70 generates a large microwave field that covers all of the sensor pixels. To this end, the microwave generator 70 may comprise a large magnetic antenna 71. The antenna 71 may be a magnetic coil that generates a microwave field in response to an electric microwave current.

In the exemplary embodiment of FIG. 1, the sensor element 10 comprises four sensor pixels P. At each sensor pixel P, a magnetic field may be sensed at the respective pixel position when the first and second radiation R1/R2 interact with one or more magneto-optically responsive defect centers and the external microwave field that is generated by the microwave generator 70.

Figure 2:
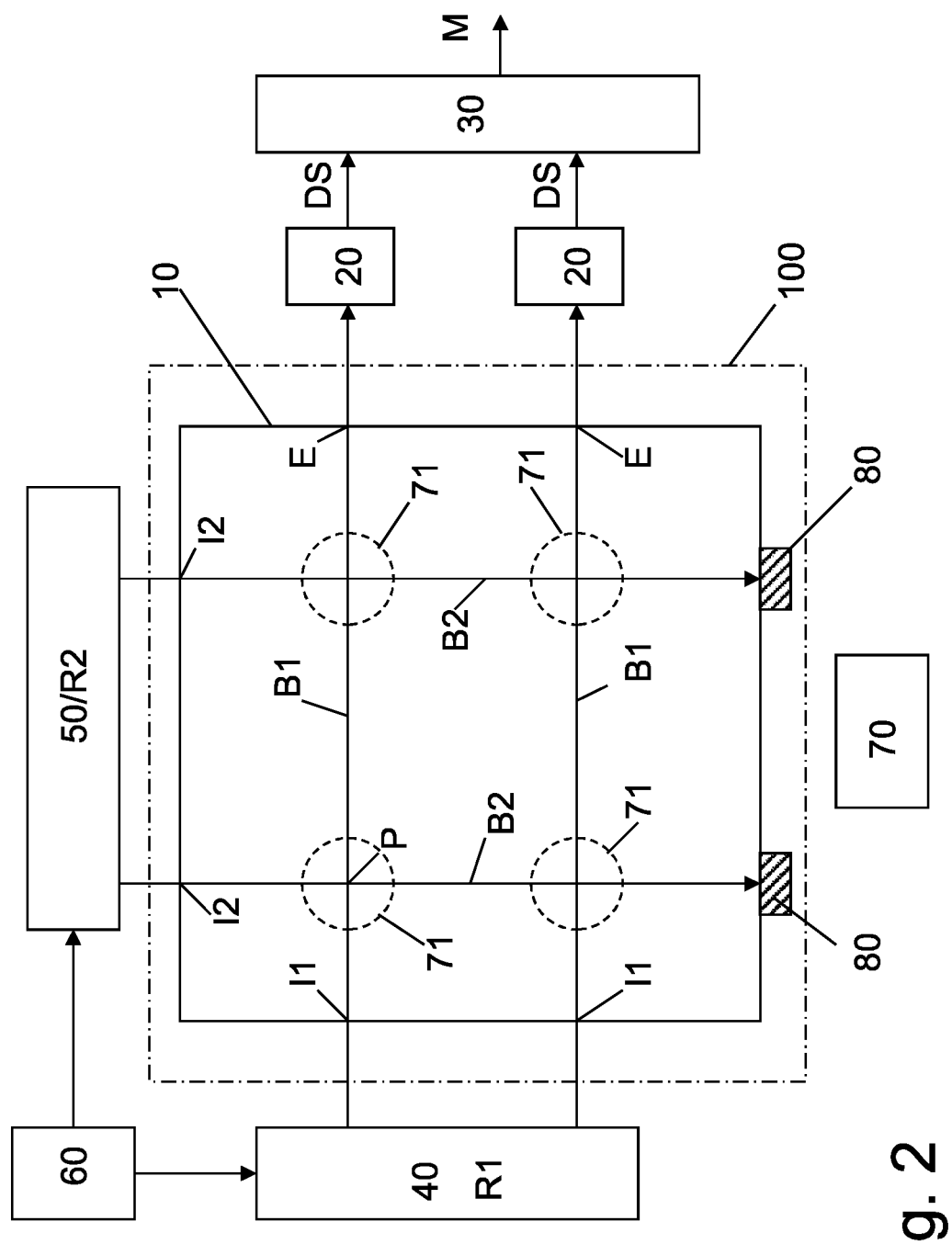
FIG. 2 illustrates a top view of a second exemplary embodiment of a sensor according to the present invention.

FIG. 2 depicts a second exemplary embodiment of a sensor according to the present invention. In FIG. 2, the microwave generator 70 generates individual fields for each of the intersections. To this end, the microwave generator 70 may comprise an individual magnetic antenna 71 (for instance a magnetic coil that generates a microwave field in response to an electric microwave current) for each of the sensor pixels P.

Figure 3:
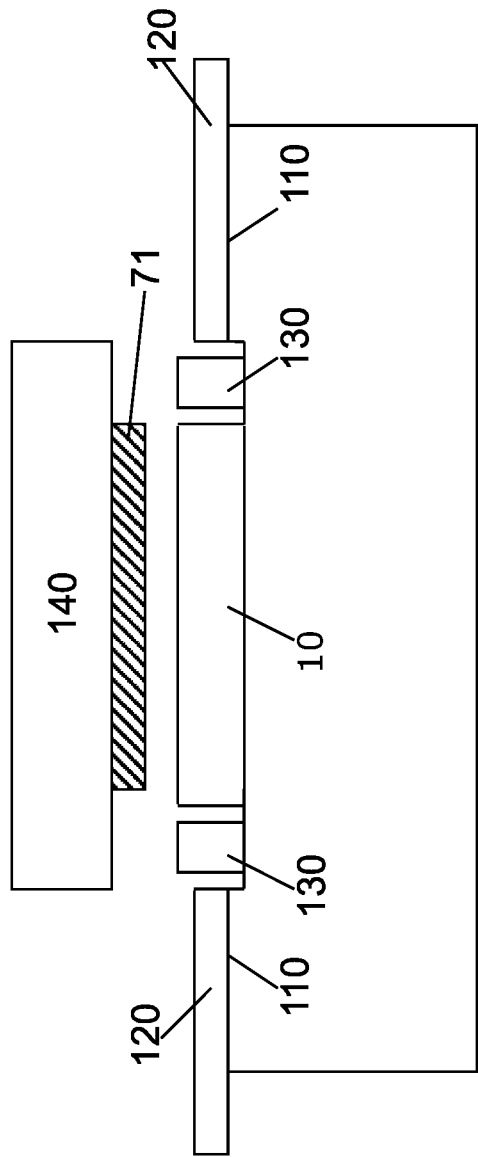
FIG. 3 illustrates a cross-section of the first exemplary embodiment.

FIG. 3 depicts a cross-section of parts of the first embodiment of FIG. 1. The sensor element 10 is mounted on a carrier 100. The carrier 100 is preferably a silicon substrate which provides V-grooves 110. The V-grooves 110 may carry fibers 120 that connect input ports I1/I2 with the first or second emitter unit 40/50 or the exit ports E with one of the detectors 20.

In order to reduce coupling losses, lenses 130 may be located between the fibers 120 and the sensor element 10.

The detectors 20 and the emitter units 40/50 which are not depicted in FIG. 3 may also be placed on the carrier 100 in order to form a photonic chip that provides the described sensing or measuring capability. Alternatively, one or more of the latter components may be located elsewhere.

FIG. 3 also shows a printed circuit board 140 that is located on top of the sensor element 10 and carries the antenna 71. The antenna 71 is part of the microwave generator 70 that generates the microwave field in the sensor element 10.

The sensor element 10 may be provided with integrated waveguides that guide the radiation through the sensor element in order to make sure that the amplitude of the radiation R1/R2 is constant (or almost constant) at all intersections or sensor pixels P.

Figure 4:
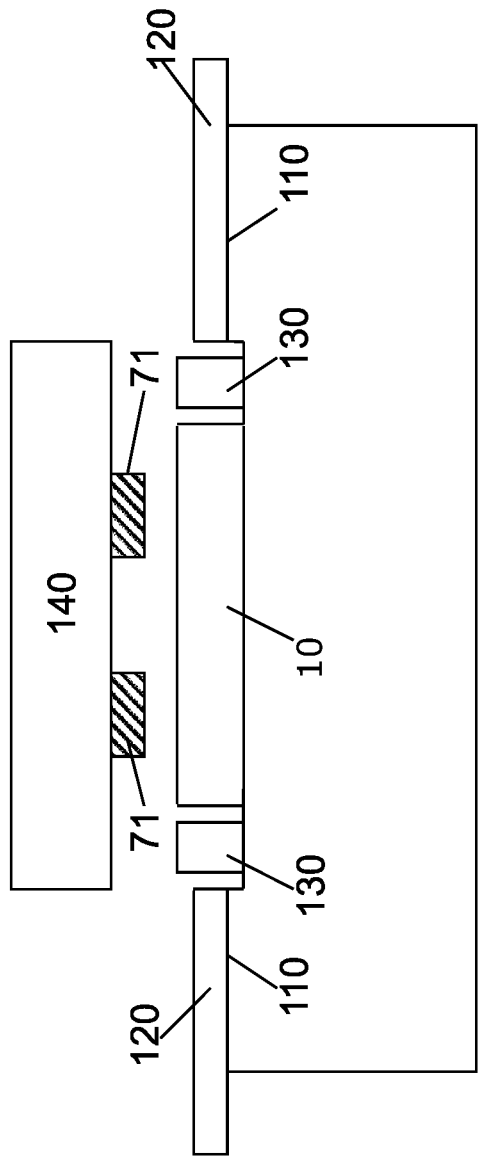
FIG. 4 illustrates a cross-section of the second exemplary embodiment.

FIG. 4 depicts a cross-section of parts of the second embodiment of FIG. 2. In contrast to the embodiment shown in FIG. 3, the printed circuit board 140 provides four antennae 71 that are individually assigned to the sensor pixels P in FIG. 4. The microwave generator 70 may therefore generate individual microwave fields in each of the sensor pixels P.

In the exemplary embodiments of FIGS. 1-4, the evaluation unit 30 may evaluate the signal strength of the detection signals DS in order to determine absorption values that indicate the absorption of the first radiation R1. The absorption values correlate with the strength of the magnetic field in the area of the activated sensor pixel P and therefore allow calculating the strength of the magnetic field for each sensor pixel P.

Alternatively, the evaluation unit may determine the absorption of both radiations R1 and R2 to allow the calculation of the strength of the magnetic field for each sensor pixel.

Further possible ways of evaluating the detection signals DS in order to calculate measurement values M that describe the magnetic field are described in the above cited publications "Magnetometry with nitrogen-vacancy defects in diamond" and "Nitrogen-Vacancy Centers in Diamond: Nanoscale Sensors for Physics and Biology".

In summary, exemplary embodiments of the invention may have one or more of the following features or characteristics:

Exemplary embodiments may relate to a system for magnetic field detection and measuring which makes use of the magneto-optical properties of a point defect centre in diamond named Nitrogen-Vacancy (NV) centre. The exemplary embodiments may consist of a diamond plate containing the optical defects spread in all its volume. The exemplary embodiments may also make use of infrared lasers and green lasers to excite ensembles of NV centres. In addition, the exemplary embodiments may include a microwave source and radiative elements (antennae 71) to control the quantum state of the NV centres. The intensity of the infrared lasers after having crossed the diamond plate may be detected by a set of photodetectors connected to a computer for analysing the measured signals.

When operating the exemplary embodiments, several parallel infrared laser beams may cross the diamond plate in one direction. Another set of parallel green laser beams may cross the diamond plate perpendicular and coplanar to the infrared lasers. The intersections of the infrared and green laser beams may create an array of pixels inside the crystal. The locations of the pixels coincide with the locations of ensembles of NV centres. The laser beams may be generated externally, transmitted by optical fibres and coupled to the diamond plate through micro-optical lenses.

The locations of the aforementioned pixels may also coincide with the locations of a set of coils which, independently, produce a homogenous electromagnetic field over the volume where the infrared and green lasers intersect. These coils may be driven by one or several microwave signal-generators. Alternatively, the set of coils may be replaced by one larger coil that irradiates homogenously the complete volume of the diamond plate where the sensor array is located.

Under green excitation and feeding the coils with a microwave at the NV centre's resonant microwave frequency, the absorption of the infrared laser by the ensembles of NV centres increases, attenuating the intensity of the infrared laser at the output of the diamond plate. Because of the magneto-optical properties of the NV centre, an external magnetic field will shift the resonant microwave frequency of the NV centre. As a consequence, its absorption coefficient decreases, producing an increment in the infrared intensity at the output of the diamond plate. This change in intensity may be detected by means of a photodetector(s). Under this scheme, the infrared intensity at the output of the crystal is related to the strength of the external magnetic field.

Exemplary embodiments may allow the sensing of a magnetic field by using any individual pixel independently. Then, every pixel works as a single magnetic sensor. The sequential reading of the infrared intensity signals allows the mapping of the magnetic field on the area covered by the sensors array. The size of the area and the spatial resolution of the mapping are determined by the number of individual sensors, the separation between the sensors and the diameter of the infrared and green laser beams.

Exemplary embodiments may be implemented in a photonic chip where the diamond crystal forms an integrated sensor array. The photonic chip may provide features for the insertion of micro-optical lenses. Each pair of opposing lenses may form a free-space section with a collimated or focused profile of the light beam. In this free-space section, the diamond crystal may be placed. The photonic chip may also provide interfaces to couple optical fibres. Due to the high resolution of the lithographic processes, small distances between the individual free-space beams are achievable, resulting in a high pixel density of the sensor.

In addition to measuring the magnetic field, the temperature and/or electric field may be determined by further evaluating the measurement results (e.g. see "Electric-field sensing using single diamond spins" (F. Dolde, H. Fedder, M. W. Doherty, T. Nöbauer, F. Rempp, G. Balasubramanian, T. Wolf, F. Reinhard, L. C. L. Hollenberg, F. Jelezko and J. Wrachtrup, Nature Physics, VOL 7, June 2011) and "Scanning Nanospin Ensemble Microscope for Nanoscale Magnetic and Thermal Imaging" (Jean-Philippe Tetienne, Alain Lombard, David A. Simpson, Cameron Ritchie, Jianing Lu, Paul Mulvaney, and Lloyd C. L. Hollenberg, ACS Publications, DOI: 10.1021/acs.nanolett. 5b03877, Nano Lett. 2016, 16, 326-333).

In another realization of the sensor array, some or all fibre-coupled external lasers and photodetectors may be replaced by integrated devices directly attached to the photonic chip, hence reducing the footprint of the setup.

The various embodiments and aspects of embodiments of the invention disclosed herein are to be understood not only in the order and context specifically described in this specification, but to include any order and any combination thereof. Whenever the context requires, all words used in the singular number shall be deemed to include the plural and vice versa. Whenever the context requires, all options that are listed with the word "and" shall be deemed to include the word "or" and vice versa, and any combination thereof.

In the drawings and specification, there have been disclosed a plurality of embodiments of the present invention.

The applicant would like to emphasize that each feature of each embodiment may be combined with or added to any other of the embodiments in order to modify the respective embodiment and create additional embodiments. These additional embodiments form a part of the present disclosure and, therefore, the applicant may file further patent claims regarding these additional embodiments at a later stage of the prosecution.

Further, the applicant would like to emphasize that each feature of each of the following dependent claims may be combined with any of the present independent claims as well as with any other (one or more) of the present dependent claims (regardless of the present claim structure). Therefore, the applicant may direct further patent claims towards other claim combinations at a later stage of the prosecution.

The invention claimed is:

1. Sensor comprising a sensor element (10) for measuring a magnetic field, the sensor element (10) comprising
    a set of at least two first input ports (I1),
    a set of at least two exit ports (E) each of which is connected to one of the first input ports (I1) via a corresponding first beam path (B1),
    a set of at least two second input ports (I2) each of which is connected to a second beam path (B2),
    wherein the first beam paths (B1) extend through a common plane (CP) located inside the sensor element (10), said plane (CP) comprising a plurality of magneto-optically responsive defect centers,
    wherein the second beam paths (B2) also extend through said common plane (CP), but are angled with respect to the first beam paths (B1) such that a plurality of intersections between the first and second beam paths (B2) is defined, and
    wherein each intersection forms a sensor pixel (P) located at at least one of said magneto-optically responsive defect centers.

2. Sensor of claim 1 wherein
    the first beam paths (B1) are parallel,
    the second beam paths (B2) are parallel, and
    the first beam paths (B1) are perpendicular to the second beam paths (B2) such that the intersections form a two-dimensional array of sensor pixels (P).

3. Sensor of claim 1 further comprising
    a set of detectors (20) each of which is individually assigned to one of said exit ports,
    an evaluation unit (30) connected to said set of detectors (20) and configured to evaluate detection signals (DS) of the detectors (20) in order to generate one or more measurement values (M),
    a first emitter unit (40) which is capable of generating a first radiation (R1) and activating at least one of the first beam paths (B1) by injecting the first radiation (R1),
    a second emitter unit (50) which is capable of generating a second radiation (R2) and activating at least one of the second beam paths (B2) by injecting the second radiation (R2),
    a control unit (60) configured to control the first and second emitter unit (40, 50), and
    a microwave generator (70) capable of generating a microwave field at the intersection points of the beam paths (B1, B2).

4. Sensor of claim 3 wherein
    the control unit (60) is configured to control the second emitter unit (50) such that maximally one of the second beam paths (B2) is provided with the second radiation (R2) in each moment of time.

5. Sensor of claim 3 wherein
    the control unit (60) is configured to control the first emitter unit (40) to input the first radiation (R1) into all of the first beam paths (B1) simultaneously, and
    the evaluation unit (30) is configured to evaluate the detection signals (DS) of the detectors (20) simultaneously in order to generate simultaneously measurement values (M) for all first beam paths (B1).

6. Sensor of claim 3 further comprising
    a printed circuit board (100) located on top of the sensor element (10) or below the sensor element (10) and providing at least one coil (71),
    wherein the microwave generator (70) is configured to provide a microwave signal to said at least one coil (71) to generate a microwave field in the sensor element (10).

7. Sensor of claim 6 wherein
    said printed circuit board (100) comprises a plurality of coils (71) each of which is assigned to one of the intersections, and
    each of the intersections is provided with a microwave field generated by the individually assigned coil (71).

8. Sensor of claim 1 further comprising
    a carrier (100) on which the sensor element (10) is mounted,
    wherein the carrier (100) provides at least one groove that carries a fiber (120), and
    wherein said fiber (120) connects one of the input ports (I1, I2) with the first or second emitter unit (40, 50), or connects one of the exit ports (E) with one of the detectors (20).

9. Sensor of claim 1 further comprising
    a carrier (100) on which the sensor element (10) is mounted,
    wherein at least one of the first and second emitter units (40, 50) comprises an emitter element that is mounted on the carrier (100) and individually assigned to one of the input ports, and/or
    wherein at least one of the detectors (20) is mounted on the carrier (100).

10. Sensor of claim 8 wherein
    at least one lens (130) is mounted on the carrier (100) between one of the input ports (I1, I2) and the respective fiber (120), between one of the emitter elements (40, 50) and the respective input port (I1, I2), or between one of the exit ports (E) and the respective detector (20).

11. Sensor of claim 1 wherein
    at least one of the first or second beam paths (B2) is provided with a waveguide that is integrated in the sensor element (10) and guides the radiation through said common plane (CP).

12. Sensor of claim 1 wherein
    reflection zones may be provided that allow the radiation to pass the beams paths at least twice.

13. Sensor of claim 1 wherein
    the sensor comprises a pixel position control unit capable of varying the positions and/or directions of the beam paths and therefore vary the positions of the intersections.

14. Method of measuring a magnetic field using a sensor according to claim 1, the method comprising the steps of
    injecting a first radiation (R1) into at least one of the first beam paths (B1),
    injecting a second radiation (R2) into at least one of the second beam paths (B2), generating a microwave field at least at the intersection point where the at least one of the first beam paths (B1) and at the least one of the second beam paths (B2) intersect, detecting the first radiation (R1), and evaluating the detected radiation and generating one or more measurement values (M) that describe the magnetic field at the intersection or intersections where the first and second radiation (R2) intercept.

15. Method of claim 14 wherein the first radiation (R1) is simultaneously injected into all of the first beam paths (B1), and the second radiation (R2) is injected into a single one of the second beam paths (B2), and measurement values (M) are generated for each of the sensor pixels (P) that belong to the activated second beam path (B2).

16. Method of claim 14 wherein evaluating the detected radiation and generating one or more measurement values (M) includes measuring the absorption of the first radiation (R1).

17. Method of claim 15 wherein evaluating the detected radiation and generating one or more measurement values (M) includes measuring the absorption of the first radiation (R1).

* * * * *